United States Patent [19]

Fessenden

[11] Patent Number: 5,895,973
[45] Date of Patent: Apr. 20, 1999

[54] ELECTRONIC COMPONENT ASSEMBLY FOR MAINTAINING COMPONENT ALIGNMENT DURING SOLDERING

[75] Inventor: Robert Gordon Fessenden, Kokomo, Ind.

[73] Assignee: Delco Electronics Corp., Kokomo, Ind.

[21] Appl. No.: 08/858,413

[22] Filed: May 19, 1997

[51] Int. Cl.$^6$ .......................... H01L 23/34; H01L 23/495
[52] U.S. Cl. .......................... 257/713; 257/712; 257/796; 257/675; 257/717; 257/719; 257/720
[58] Field of Search .................... 257/713, 712, 257/714, 675, 717, 719, 720, 722, 796; 361/709, 701–703

[56] References Cited

U.S. PATENT DOCUMENTS

| | | | |
|---|---|---|---|
| 5,602,720 | 2/1997 | Natsuhara et al. | 257/712 |
| 5,629,562 | 5/1997 | Nomura et al. | 257/712 |
| 5,721,455 | 2/1998 | Takashita | 257/712 |

FOREIGN PATENT DOCUMENTS

| | | | |
|---|---|---|---|
| 5-21667 | 1/1993 | Japan | 257/713 |
| 5-326824 | 12/1993 | Japan | 257/713 |

*Primary Examiner*—Mahshid Saadat
*Assistant Examiner*—Jhihan B. Clark
*Attorney, Agent, or Firm*—Jimmy L. Funke

[57] ABSTRACT

An aligned electronic circuit component assembly for attaching components onto larger mounting members at predetermined positions thereon are provided. The mounting or heat spreader members include shift resistant regions which are disposed in close proximity or substantially aligned with peripheral portions or edges of the component die when the die is placed in its predetermined position on an associated mounting or base member. The shift resistant regions can include non-linear edge surfaces, such as the edge surfaces around notches in the members, so as to provide areas on the base or heat spreader member which do not have solder thereon. It has been found that the surface tension of the liquid solder during reflow acts to provide a restraining force at the edge surfaces so as to restrain the electronic component from shifting from the desired position on the base member. In addition, the notches are formed in a pattern around the base heat spreader member which keeps them to a minimum number so that the heat spreader is large enough to ensure proper heat dissipation from the circuit component while still restraining shifting of the component, either rotationally about an axis extending through the component or translationally across the layer of liquid solder. Accordingly, efficient high volume production of precisely aligned circuit component assemblies including component dies attached on base members at predetermined positions thereon can occur utilizing a solder reflow process.

10 Claims, 4 Drawing Sheets

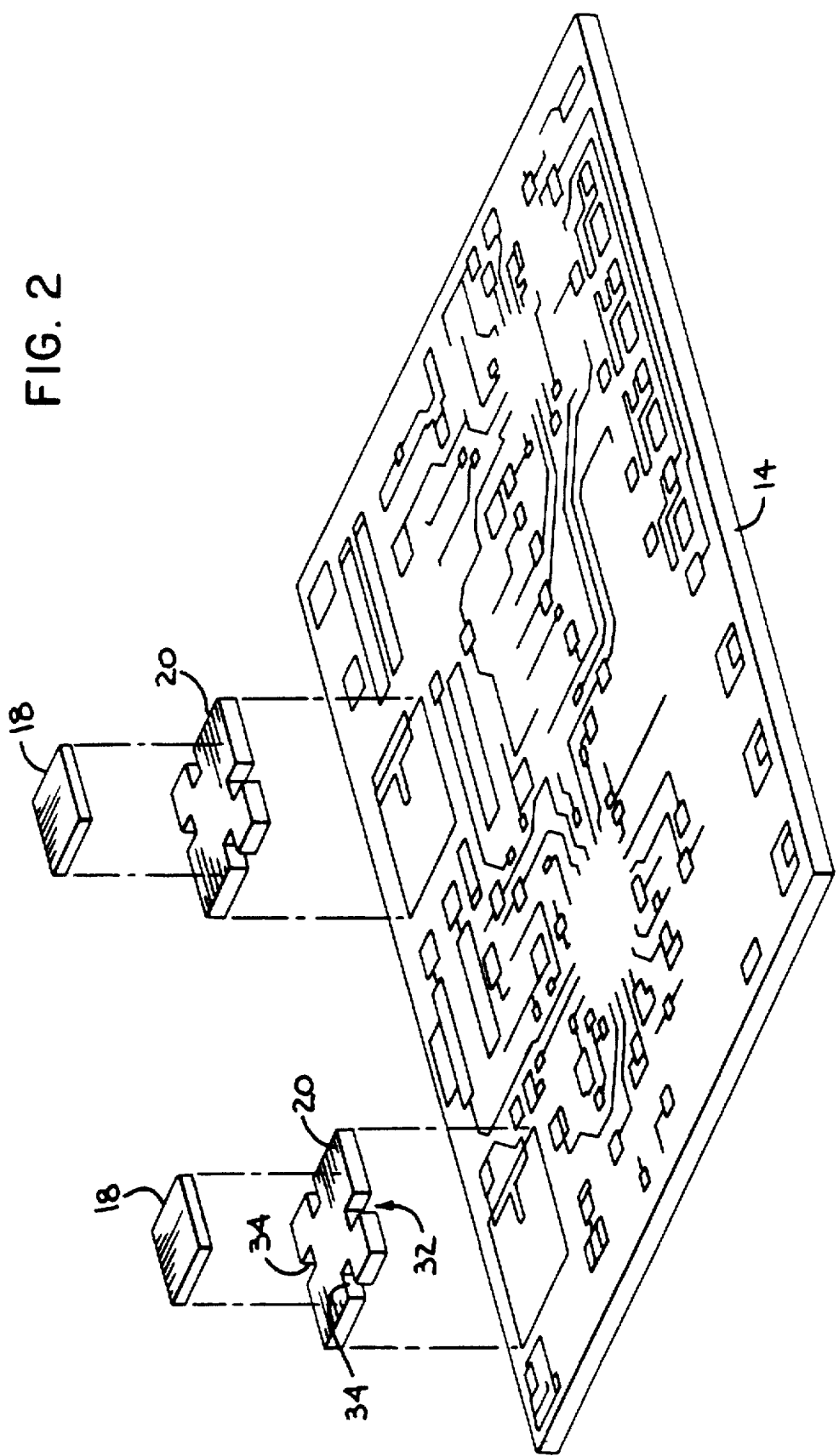

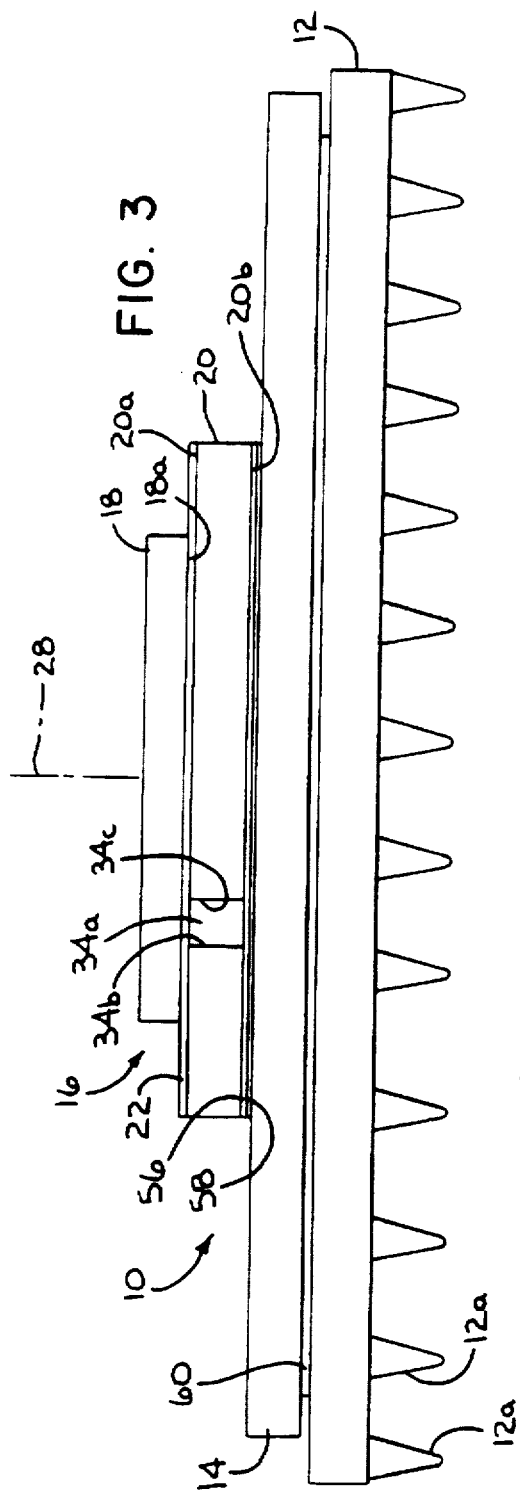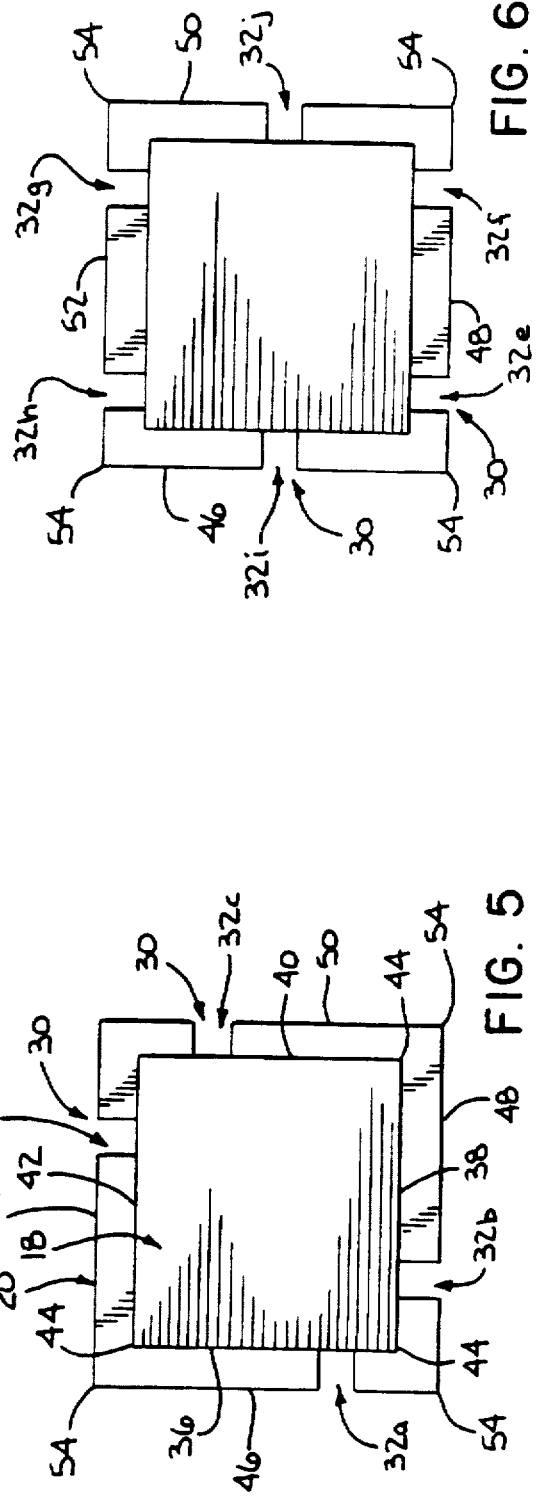

ELECTRONIC COMPONENT ASSEMBLY FOR MAINTAINING COMPONENT ALIGNMENT DURING SOLDERING

FIELD OF THE INVENTION

The invention relates to electronic component assemblies and, more particularly, to an aligned electronic circuit component assembly for attaching components onto mounting members at predetermined positions thereon.

BACKGROUND OF THE INVENTION

During assembly of electronic components to mounting members, it is oftentimes important that the components be able to be precisely mounted in a predetermined position to provide for repeatability in assembly thereof. For assembly, the base member can be printed or coated with a layer of solder material thereon for attaching the die of the electronic component thereto. Automated vision systems can be utilized to locate contact points for wire bonding leads to the components attached on the base member. Where the component is to be utilized in a circuit, consistent location of the component is important to allow leads to be connected in a quick and efficient manner without having to take into account variations in locations of the contact points on the electronic component. However, where there is misalignment in the mounting of the component on the base member, the above-mentioned vision systems may not be able to adequately compensate for variations in the location of the wire contacts on the component assembly due to the misalignment. In addition, where the mounting member is a larger heat spreader for heat dissipation purposes, any shifting of the component on the spreader can reduce the efficiency of the heat transfer from the component to the spreader, and thus the heat dissipated from the spreader. In one known method for attaching components in proper alignment on mounting members, the component is placed onto the solder coat on the mounting member, and is ultrasonically welded by rapid agitation generated at the interface between the component die and the solder layer.

On the other hand, a reflow process for attaching electronic component dies and mounting members would be preferable over the above-described ultrasonic welding process. With a reflow process, high volume production of attached components can occur in an efficient manner with the parts being continuously run through a reflow oven. However, the problem in placing the components on the solder coated mounting members and running them through a reflow oven is that absent a mechanical fixturing and aligning device, the components are not restrained in the desired position for attachment to the mounting members. Thus, once the solder is heated and reflows in the oven, the component will be floating on a liquid layer of material such that any external forces applied to the floating component can cause it to shift from the predetermined position. Accordingly, any exhaust drafts in the oven, vibrations of the conveyor, etc. can cause the component to move on the liquid solder layer from the predetermined position. As described earlier, such movement or shifting is undesirable for subsequent wire bonding of leads to the component and for heat transfer purposes. Thus, there is a need for an assembly which accurately aligns and attaches the components in a predetermined position on a base mounting member in a consistent and repeatable manner by reflowing of a solid solder material therebetween to facilitate efficient high volume production of these component assemblies.

In one particular application herein, the electronic component is a power transistor and the base member is a larger heat spreader with the attached transistor and heat spreader being utilized in an automotive ignition module. In this application, the transistor generates heat and is also exposed to a high temperature environment in that it is engine mounted. At certain high temperatures, the durability of the transistor can be adversely affected; accordingly, it is important to keep the transistors below such critical temperatures for maximizing their performance. In this regard, the heat spreader is larger than the transistor die for proper dissipation of heat generated during use of the transistor. The larger heat spreader is coated with solder for attaching the transistor die thereto, and, if the solder is reflowed, the previously described problem of having the transistor component float and shift on the heat spreader will occur. Keeping the solder coated member to the same size as the die is not done in this application as the heat spreader must be larger than the die to properly dissipate heat from the transistor. Accordingly, there is a need for a transistor component assembly for manufacture thereof which keeps the transistor component aligned on the larger heat spreader and also keeps the size of the heat spreader sufficiently large to ensure proper heat dissipation from the transistor during use.

SUMMARY OF THE INVENTION

The present invention relates to an aligned electronic circuit component assembly for attaching components onto larger mounting members at predetermined positions thereon with the members including shift resistant regions which are disposed in close proximity or substantially aligned with peripheral portions or edges of the component die when the die is placed in its predetermined position on an associated mounting or base member. The shift resistant regions can include non-linear edge surfaces, such as the edge surfaces around notches in the members, so as to provide areas on the base or heat spreader member which do not have solder thereon. It has been found that the surface tension of the liquid solder during reflow acts to provide a restraining force at the edge surfaces so as to restrain the electronic component from shifting from the desired position on the base member. In addition, the notches may be formed in a pattern around the base heat spreader member which keeps them to a minimum number so that the heat spreader is large enough to ensure proper heat dissipation from the circuit component while still restraining shifting of the component, either rotationally about its center axis or translationally across the layer of liquid solder. Accordingly, with the inventive assembly and process herein, efficient high volume production of precisely aligned circuit component assemblies including component dies attached on base members at predetermined positions thereon can occur utilizing a reflow process, as is desirable.

More particularly, in one form of the invention, the component assembly herein can include a die body for the electronic circuit component with the die body having a lower surface and peripheral edges thereof. A base member is provided to which the die body is to be attached at a predetermined position thereon, with the base member having an upper surface larger than the lower surface of the die body. Substantially solid material between the die body lower surface and base member upper surface is provided for being heated to a liquid state and solidifying and hardening to fix the die body to the base member in the predetermined position. A predetermined number of shift resistant regions are provided and include non-linear edge surfaces on the base member in close proximity to the die body peripheral edges with the die body in its predetermined position so that when the solid material is heated to form a layer of liquid between the die body and the base member, the surface tension of the liquid layer restrains the component against shifting from its predetermined position on the liquid layer, so that the component is attached to the base in the predetermined position when the liquid material hardens.

In one form, the base member is a heat spreader body larger than the die body for being attached to a circuit board and for dissipating heat generated from use of the electronic component, and the solid material is a solder coating on the heat spreader body. The predetermined number of shift resistant regions of the base are cutout regions in the heat spreader body having edge surfaces substantially aligned with i.e., the die disposed directly beneath, portions of the die body peripheral edges. The predetermined number of heat spreader cutout regions may be substantially minimized to best enable the heat spreader to dissipate the heat generated from use of the component.

As previously mentioned, the shift resistant regions or notches around the base may be formed in a pattern which minimizes the amount of material removed from the base member while still restraining the component from shifting on the layer of liquid formed when the solder is reflowed, both rotationally about a vertical axis extending through the component die, and translationally, in an X-Y horizontal plane across the liquid layer. In a preferred form, the shift resistant regions are provided as two pairs of notches in the base member disposed adjacent diagonally opposite corners thereof so that with the components centered on the base member, the component will be restrained from rotational shifting on the liquid layer. In another form, the number of notches is increased to six (6) with pairs of notches formed in the heat spreader member along opposite sides thereof with notches in the pairs being closer to the corner than to the other notch in the respective pair. In addition, a single notch is formed along opposite sides that do not include the notch pairs with the single notches being substantially centered intermediate the corners on either end of their sides. Other patterns that are consistent with the dual goals of minimizing material removed from the base member while keeping the die in predetermined position against shifting during solder reflow can also be utilized.

In another form of the present invention, a power transistor assembly for an automotive ignition module is provided and includes a die body for a power transistor circuit component with the die body having a first predetermined size. A heat spreader member is provided for mounting the die body thereto and dissipating heat generated by use of the power transistor component. The heat spreader member has a second predetermined size larger than the die body first predetermined size. A solder material is between the die body and the heat spreader member for being heated and reflowed to form a layer of liquid solder on which the die body is supported for being attached to the heat spreader member when the liquid solder solidifies. Notches are formed around the heat spreader member with peripheral portions of the die body being substantially aligned with the notches for resisting lateral and rotational shifting of the die body floating on the liquid solder layer by the restraining force of the surface tension of the liquid solder at the notches. In this manner, the die body is attached to the heat spreader member at a predetermined position thereon when the solder solidifies. Accordingly, the present transistor assembly does not require an ultrasonic welding machine or any special fixturing as with prior assemblies for ensuring proper alignment of the component die on the base or heat spreader member.

The shift resistant regions can be provided by forming notches in the mounting members to remove material therefrom, including the reflowable solid material thereon. Thus, the present invention utilizes mounting members that are relatively inexpensive to manufacture in that a simple stamping operation can be performed to create mounting members with notches therein to form the shift resistant regions thereof.

BRIEF DESCRIPTION OF THE DRAWINGS

FIG. 2 is an enlarged view of the module of FIG. 1 showing the transistor assembly exploded therefrom and including a die body and a heat spreader member;

FIG. 3 is a side elevational view of the ignition module of FIG. 1 showing the transistor die body soldered to the heat spreader member in predetermined aligned position thereon;

FIG. 5 is a plan view of the transistor assembly showing a preferred notch pattern in the heat spreader member;

FIG. 6 is a plan view of a transistor assembly showing an alternative pattern for the notches of the heat spreader member.

DETAILED DESCRIPTION OF THE PREFERRED EMBODIMENT

Figure 1:
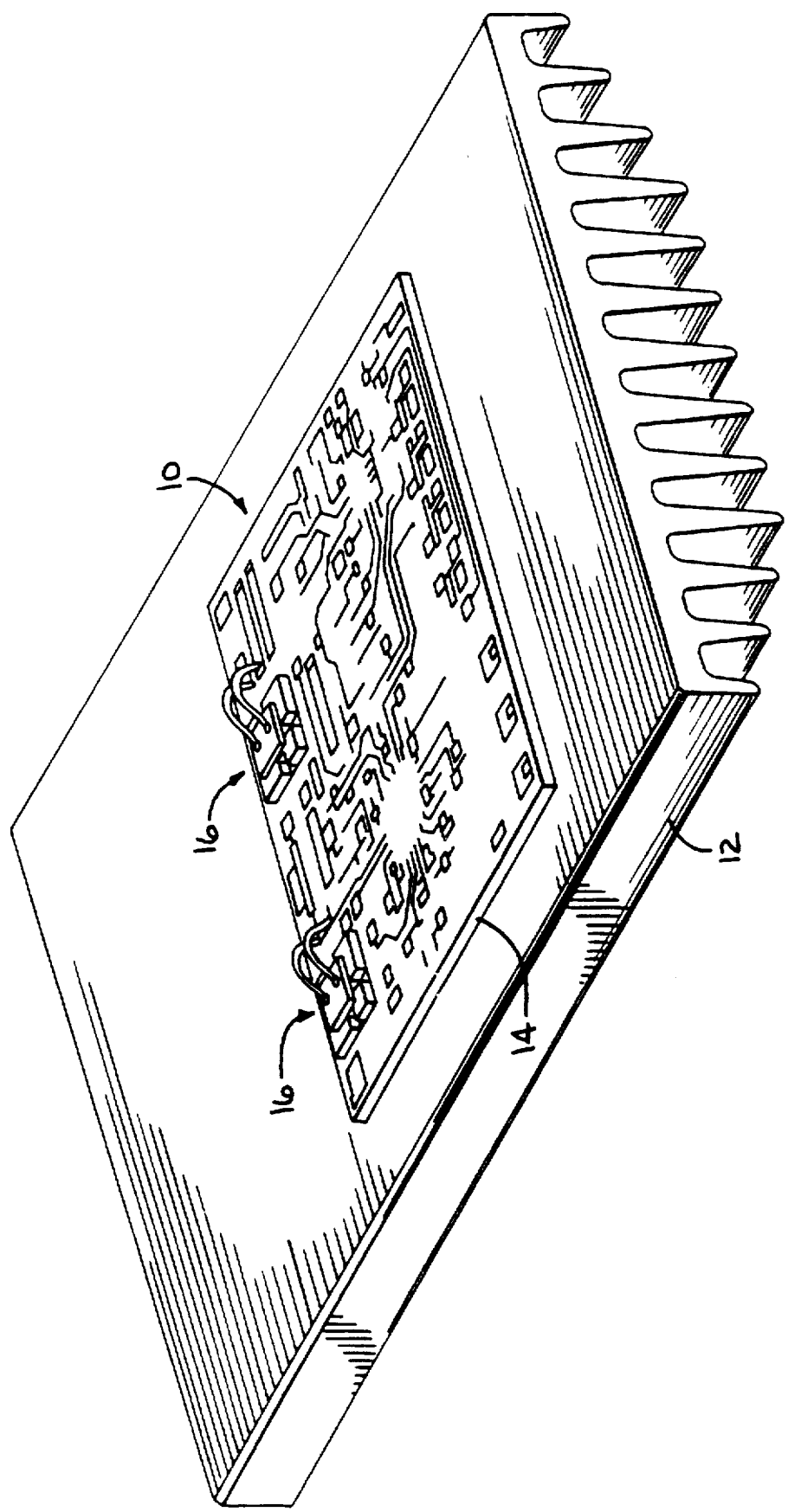
FIG. 1 is a perspective view of a power transistor assembly in accordance with the present invention showing the assembly connected on a circuit board of an automotive ignition module with the module being attached to a heat sink extrusion.

FIG. 1 illustrates an auto ignition module 10 adhered to a finned aluminum extrusion heat sink member 12 for an automotive ignition system. The ignition module 10 is for turning on and off the current to the coil primary winding in response to a spark timing trigger signal. The ignition coil (not shown) converts low voltage high current energy stored in the primary to high voltage low current energy in the secondary coils for firing a spark plug, as is known. The ignition module 10 includes a ceramic substrate or printed circuit board 14 having various electronic components and circuits thereon. Accordingly, the module 10 is subject to fairly harsh operating conditions in terms of the extreme temperatures and high vibration environment which can be found in an automotive ignition system. One of the module components is a power transistor component assembly 16 in accordance with the present invention which includes a transistor silicone wafer or die body 18 and base or heat spreader member 20 with the die 18 being attached at a predetermined position on the heat spreader member 20 as by a solder reflow process, which will be more fully described hereinafter. Although the present component assembly 16 is described with respect to a transistor for an ignition module, the component assembly 16 herein can also include other electronic components which can be employed in a variety of different applications besides the automotive application described herein.

As previously mentioned, it is known to ultrasonically vibrate the die body 18 so as to attach the body to the solder 22 coated on the heat spreader member upper surface 20a. However, the requirements of an ultrasonic welding apparatus and the attendant fixturing requirements for the die 18 and member 20 are undesirable from a cost standpoint. By contrast, the present invention provides an efficient high-volume reflow process for soldering dies 18 to base members 20 to significantly reduce the cost associated with manufacture of the power transistor assembly 16 herein. In accordance with the present invention, an aligned electronic component assembly 16 is provided by a reflow process (FIG. 7) wherein a layer of substantially reflowable solid material 22 such as solder on the base member 20 is utilized to attach the component die body 18 to the base heat spreader member 20, as best seen in FIG. 3. To keep the die 18 properly aligned during the reflow process, the member 20 includes a pattern of shift resistant regions 30 (FIGS. 5 and 6) which preferably lack any solder 22 thereon so that surface tension forces of the reflowed solder act at the boundary of the regions 30 to substantially prevent shifting of the die 18 thereover, as will be more fully described herein.

Where the electronic component is a power transistor for use in the illustrated auto ignition module 10, the transistor 18 can be an Insulated Gate Bipolar Transistor (IGBT) having a power rating of approximately 3 watts and which can take currents of 9 amps, and the base member 20 is utilized to diminish the transistor thermal loads by dissipating heat generated during use of the transistor component 18. In this regard, it is preferred that the heat spreader member 20 be larger than the transistor die body 18 so as to be able to properly dissipate heat from the transistor assembly 16 to keep the transistor component at a sufficiently low temperature to ensure long-life operation thereof. Generally, it is desirable that the transistors be kept at temperatures below 175° C., as at a higher temperatures, their durability can be adversely affected.

Figure 4:
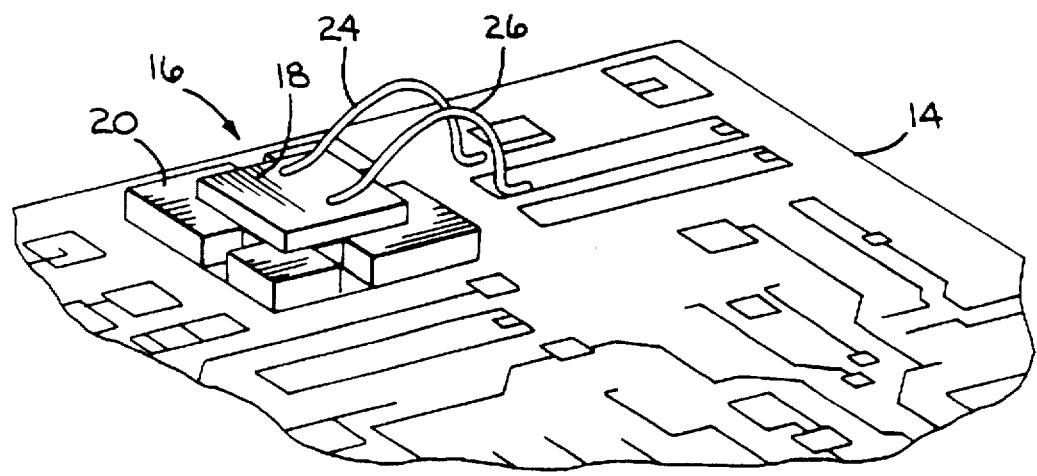
FIG. 4 is an enlarged perspective view of the ignition module of FIG. 1 showing the transistor assembly electrically connected to circuits on the circuit board.

Referring to FIG. 4, the transistor component assembly 16 is electrically attached by leads 24 and 26 to the circuitry on the ceramic substrate 14. In order to efficiently wire bond the leads 24 and 26 to the transistor component assembly 16 as by use of an automated vision system, it is important that the dies 18 be mounted onto the heat spreader members 20 at predetermined positions thereon so as to provide consistent locations for attaching the leads 24 and 26 thereto. As discussed earlier, the problem with reflowing the solder 22 on the heat spreader member 20 is that the die 18 tends to shift either rotationally about a vertical axis 28 extending therethrough or translationally in an X-Y direction across the solder layer 22. The shifting of the die 18 from its predetermined position on the heat spreader member 20 is undesirable as shifting will cause the contact points in the transistor emitter gate on the transistor die 18 to move from the normal orientation so that properly connecting the leads 24 and 26 requires that the transistor contacts be located separately for each assembly 16 before the leads 24 and 26 are attached thereto. Variations between the location of the die 18 on the assemblies 16 thus does not readily allow for automated operations to be utilized for connecting leads 24 and 26 to the dies 18. For example, 15° of rotation combined with a few thousands of an inch shifting in an X and/or Y direction could be sufficient movement to exceed the capabilities of the vision system to compensate for the misalignment so that inaccurate wire bonding would take place. In addition, any shifting could adversely affect the ability of the heat spreader member 20 to dissipate heat properly as when the die 18 shifts from its predetermined aligned, centered position on the heat spreader member 20 and is attached thereat, there will be portions of the die 18 that are closer to the heat spreader member peripheral edges leaving less material of the member 20 for heat to transfer from the die portions and to dissipate into the member 20.

In accordance with the present invention, the heat spreader member 20 is provided with the previously-mentioned shift-resistant regions 30 around its periphery to minimize or substantially eliminate any such shifting of the die body 18 during the reflow process. The shift-resistant regions 30 of the heat spreader member 20 do not include the solid solder 22 printed or coated thereon as on the remainder of the member upper surface 20a. The shift-resistant regions 30 can be in the form of notches 32 formed in the heat spreader member 20 around the periphery thereof so that with the smaller die member 18 centered on the heat spreader member 20 in its predetermined position thereon, non-linear edge surfaces 34 of the notches 32 are in close proximity to the periphery of the die body 18. It has been found that at the shift-resistant region edges 34, the surface tension of the liquid solder 22 will provide a restraining force against shifting of the die body 18 from its predetermined position on the liquid solder layer so that the component will be attached to the heat spreader member 20 in the predetermined position when the liquid, reflowed solder material 22 sets up and solidifies or hardens. It is also possible that the shift-resistant regions 30 can be formed by removing solder from the solder coat 22 on the heat spreader surface 20a at the locations where the notches 32 would be provided and/or by countercoating solder resist in a mirror image pattern to that of the solder coat 22 on the heat spreader member 20. However, the notches 32 are preferred for manufacturing reasons as this allows the heat spreader member 20 to be printed with a coat of solder 22 over its entire upper surface 20a and then to be stamped to remove the notches 32 therefrom in the desired pattern around the periphery of the heat spreader member 20.

In the preferred and illustrated form, the die body is a shown as having a substantially rectangular or square configuration with peripheral die side edges 36–42 which form corners 44 at their junctures. Similarly, the heat spreader member 20 has a substantially rectangular or square configuration with peripheral side edges 46–52 with these side edges being longer than the corresponding die side edges 36–42 so that the heat spreader member 20 is larger than the die body 18. The member side edges 46–52 also meet and form corners 54 at their junctures. As best seen in FIG. 5, in the preferred pattern for the shift resistant region 30, notches are formed in the heat spreader member 20 around the peripheral edges 46–52 thereof so that there are pairs of notches 32a, 32b and 32c, 32d which are adjacent diagonally opposite corners 54 of the base member 20. Preferably, the notches 32a and 32b are stamped from the member 20 so that they form generally square shaped openings which can open to the respective member peripheral side edges 46 and 48. Similarly, notches 32c and 32d are stamped from member 20 so that they form generally square shaped openings which can open to the respective member peripheral side edges 50 and 52. Although the invention also contemplates forming shift resistant openings through the members 20 which do not open to the member edges 46–52, it is preferable that they open to the edges 46–52 for ease of manufacturing in stamping of the members 20. In this regard, it is also desirable that the width of the notches 32 be at least one and one-half times greater than the material thickness of the heat spreader member 20 between the upper and lower surfaces 20a and 20b thereof to reduce tool wear and breakage which could occur if smaller notches were stamped from the member 20.

With the die body 18, and more particularly the lower surface 18a thereof, placed centered over the heat spreader upper surface 20a on the solid solder layer 22 therebetween, the distance between die sides 36–42 and corresponding member sides 46–52 will be substantially the same around the entire extent of the die 18 and member 20, and the sides 36–42 of the die 18 will be substantially vertically aligned with the inner edge surface 34a. The notch inner edge surfaces 34a extend substantially parallel to the respective member side edges 36–52 and are spaced inwardly therefrom by substantially the distance between the die sides 36–42 and the corresponding member sides 46–52. In addition to the edge surfaces 34a, the shift resistant regions 30 are bounded by edge surfaces 34b and 34c which extend perpendicular from either end of their associated edge surface 34a to the respective member side edges 46–52 so that the edge surfaces 34a–34c taken together form the non-linear edge surfaces 34 of the heat spreader member 20 which define the shift resistant regions 30 thereof. Other configurations for the non-linear edge surfaces 34 can also be provided within the purview of the present invention.

Accordingly, with the notch pairs 32a, 32b and 32c, 32d having their respective edge surface 34a in alignment with the die side edges 36–42 when the die 18 is placed centered on the heat spreader member 20, the edge surfaces 34a will be in framing relation to the die side edges 36–42 and will have diagonally opposite corners 44 of the die 18 therebetween so as to resist any rotational shifting of the die 18 about its center axis 28 during the reflow process for the solder material 22. In addition, the location of the notch pairs 32 and edge surfaces 34a thereof closely adjacent opposite die corners 44 on either side thereof will also act to resist any translational shifting in an X or Y direction across the liquid solder layer during the reflow process. The pattern of FIG. 5 is preferred in that only four (4) notches 32a–32d are employed to resist both rotational and translational shifting of the die 18 on the liquid solder layer. In this manner, the amount of material removed from the heat spreader member 20 is minimized so as to ensure that there is sufficient material in the member 20 for it to properly dissipate heat from the power transistor component 18 during operation thereof.

FIG. 6 illustrates an alternative notch pattern around the heat spreader member 20 which is also effective in resisting shifting of the die body 18 on the liquid solder layer during reflow of the solder; however, the pattern of FIG. 6 utilizes six (6) notches 32 around the peripheral edges 46–52 of the heat spreader member 20 and, accordingly, is less preferred for heat dissipation purposes due to the increased amount of material removed from the member 20. In the pattern of FIG. 6, there are two pairs of notches 32e, 32f and 32h, 32g formed in respective member side edges 48 and 52 with the notches 32 in each pair being closer to an adjacent corner 54 of the heat spreader member 20 than to each other. In addition, single notches 32i and 32j associated with respective member side edges 46 and 50 are formed intermediate or midway between the corners 54 at either end of their respective sides 46 and 50.

By way of example, the sides 36–42 of the IGBT component 18 can each be of a length of approximately 0.150 inch and side edges 46–52 of the heat spreader member 20 can be of a length of approximately 0.250 inch with the heat spreader 20 having a thickness between its upper and lower surfaces 20a and 20b of approximately 0.025 inch. The thickness of the solder layer 22 is preferably in the range of approximately 0.003 inch to approximately 0.005 inch thick with the solder material being 25 Sn/75 Pb. The material for the heat spreader 20 is preferably Cu/Invar/Cu clad. Invar refers to a Nickel/Iron alloy which is preferably approximately 36% Nickel with the balance substantially being Iron. To attach the heat spreader 20 to the ceramic substrate 14, a layer 56 of 25 Sn/75 Pb solder is applied over a Pd/Ag thick film conductor layer 58 on the substrate 14. The solder layer 56 preferably has a thickness in the range of approximately 0.002 inch to approximately 0.006 inch and the thick film conductor layer 58 preferably has a thickness in the range of approximately 0.0005 inch to approximately 0.001 inch. As previously mentioned, the module 10 including the aligned power transistor assembly 16 soldered on the ceramic substrate 14 is adhered to the top of an aluminum extrusion heat sink member 12 which includes a plurality of fins 12a formed at the bottom thereof to dissipate heat therefrom. The ceramic substrate is preferably 96% alumina and has a thickness of approximately 0.035 inch and is attached to the top of the heat sink 12 by a layer of thermally conductive adhesive 60 having a thickness in the range of approximately 0.002 inch to approximately 0.012 inch. The bottom of the die 18 preferably is gold metallized to provide for good wetting when the solder layer 22 is reflowed. The amount of solder in the layers 22 and 56 is carefully controlled so as to ensure that the notches 32 do not fill with liquid solder during the reflow process.

Figure 7:
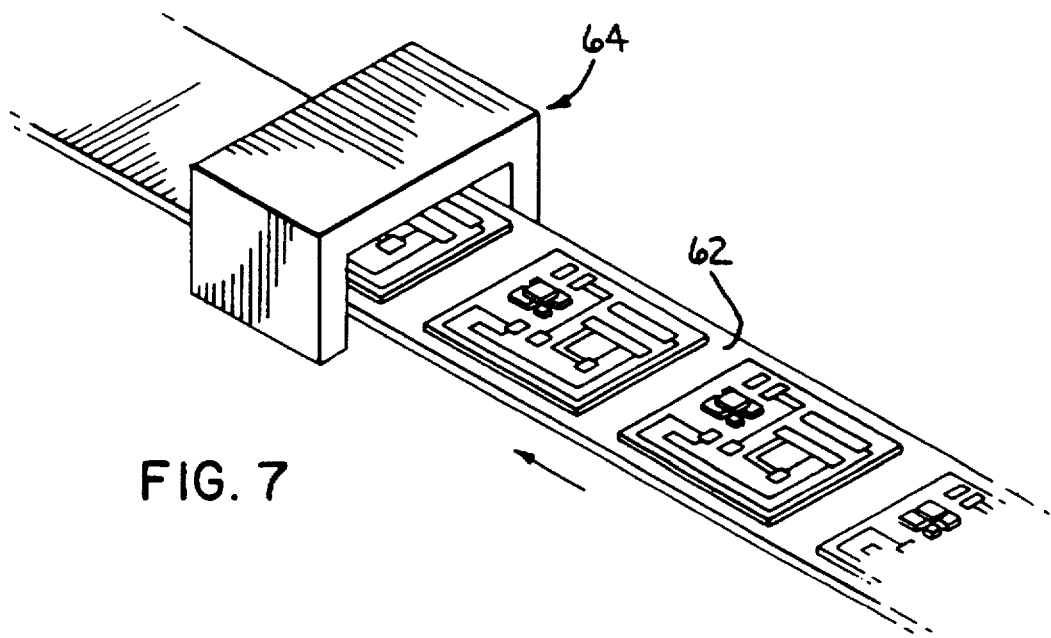
FIG. 7 is a perspective schematic view of the reflow process for high volume manufacture of the circuit component assemblies herein showing the assemblies run through a reflow oven for attaching the dies in aligned positions on the heat spreader members.

FIG. 7 illustrates the reflow process, including a conveyor 62 which travels through a heated zone provided in reflow oven 64. The conveyor 62 supports substrate 14 including the heat spreader members 20 and the dies 18 which are placed on the members 20 in centered relation thereto, as previously described. As the dies 18 and their associated heat spreaders 20 travel through the oven, the solder layers 22 and 56 will liquify and the dies 18 will be supported on a liquid layer of solder with the shift resistant regions 30 acting to maintain the dies 18 in their centered relation on the heat spreader members 20 at the predetermined aligned, positions thereon despite external forces that may be applied to the dies 18 during their travel through the oven 64 which would tend to make them shift on the liquid solder, e.g. vibrations of the conveyor 64 or exhaust drafts from the oven 64. Accordingly, when the reflowed solder solidifies after exit from the reflow oven 64, the dies 18 will be attached in a consistent manner at the predetermined position on their respective heat spreader members 20. In this manner, the present invention facilitates high volume production of aligned electronic component assemblies 16 by way of a solder reflow process, such as depicted in FIG. 7.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

I claim:

1. An aligned electronic circuit component assembly comprising:

a die body for the electronic circuit component, the die body having a lower surface and peripheral edges thereof;

a base member to which the die body is to be attached at a predetermined position thereon, the base member having an upper surface larger than the lower surface of the die body;

a layer of substantially solid material between the die body lower surface and base member upper surface for being heated to a liquid state and solidifying to fix the die body to the base member in the predetermined position; and a predetermined number of notches formed in a periphery of the base member in close proximity to the die body peripheral edges with the die body in its predetermined position so that when the solid material is heated to form a layer of liquid between the die body and the base member, the surface tension of the liquid layer at said notches restrains the component against shifting from its predetermined position on the liquid layer, so that the component is attached to the base in the predetermined position when the liquid material hardens.

2. The assembly of claim 1 wherein the base member is a heat spreader body larger than the die body for being attached to a circuit board and for dissipating heat generated from use of the electronic component, and the solid material is a solder coating on the heat spreader body, and the predetermined number of notches formed in the base are cut out regions in the heat spreader body having edge surfaces substantially aligned with the die body peripheral edges, with said predetermined number of heat spreader cut out regions being substantially minimized to enable the heat spreader to dissipate the heat generated from use of the component.

3. The assembly of claim 1 wherein the base member includes corners with the base member notches being adjacent the corners thereof to resist rotational shifting of the component on the layer of liquid material.

4. The assembly of claim 1 wherein the base member has a substantially rectangular shape defined by four sides and corners at the juncture of such sides and the predetermined number of notches are formed at predetermined locations along such sides spaced from the corners to resist rotational shifting of the die body on the layer of liquid material.

5. The assembly of claim 4 wherein the notches include two pairs of notches with each pair adjacent diagonally opposite corners of the base member.

6. The assembly of claim 4 wherein the notches include:

two pairs of notches with one pair being along a first side of the base member and the other pair along a second side of the base member opposite said first side wherein each notch in the pairs is closer to an adjacent base member corner than to the other notch in the pair, and single notches along third and fourth sides of the base member.

7. A power transistor assembly for an automotive ignition module, the power transistor assembly comprising:

a die body for a power transistor circuit component, the die body having a first predetermined size;

a heat spreader member for mounting the die body thereto and dissipating heat generated by use of the power transistor component, the heat spreader member having a second predetermined size larger than the die body first predetermined size;

a solder material between the die body and the heat spreader member which is heated to reflow the solder and form a layer of liquid solder for supporting the die body thereon and for attaching the die body to the heat spreader member when the liquid solder solidifies; and notches around the heat spreader member with peripheral portions of the die body being substantially aligned with the notches for resisting translational and rotational shifting of the floating die body on the liquid solder layer by the restraining force of the surface tension of the liquid solder at the notches to attach the die body to the heat spreader member at a predetermined position thereon when the solder solidifies.

8. The assembly of claim 7 wherein the notches are formed in a predetermined pattern around the heat spreader member to substantially minimize the number of notches for keeping the die body aligned at the predetermined position while floated on the liquid solder layer with said minimum number of notches keeping the second predetermined size of the heat spreader larger than the first predetermined size of the die body for heat dissipation from the power transistor circuit component.

9. The combination of claim 8 wherein the heat spreader member has a substantially rectangular configuration including sides and corners with the die body predetermined position being substantially centered on the rectangular heat spreader member, and the predetermined notch pattern includes pairs of notches adjacent diagonally opposite corners of the heat spreader member to resist shifting of the die body from its substantially centered predetermined position on the heat spreader member when the solder is in its liquid state.

10. The combination of claim 8 wherein the heat spreader member has substantially rectangular configuration including sides and corners with the die predetermined position being substantially centered on the rectangular heat spreader member, and the predetermined notch pattern includes pairs of notches formed along opposite sides of the heat spreader member with the notches in the pairs closer to adjacent corners than to each other and single notches formed on opposite sides of the heat spreader which do not have the notch pairs intermediate the corners thereof.

* * * * *